(12) United States Patent
Takase et al.

(10) Patent No.: US 6,490,210 B2
(45) Date of Patent: Dec. 3, 2002

(54) SEMICONDUCTOR MEMORY INTEGRATED CIRCUIT EMPLOYING A REDUNDANT CIRCUIT SYSTEM FOR COMPENSATING FOR DEFECTIVENESS

(75) Inventors: Satoru Takase, Yokohama (JP); Takeshi Nagai, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/867,796

(22) Filed: May 31, 2001

(65) Prior Publication Data

US 2001/0050871 A1 Dec. 13, 2001

(30) Foreign Application Priority Data

Jun. 7, 2000 (JP) .......................................... 2000-170613
Apr. 16, 2001 (JP) .......................................... 2001-116661

(51) Int. Cl.$^7$ ................................................ G11C 7/00
(52) U.S. Cl. .................... 365/201; 365/200; 365/230.06
(58) Field of Search ................................ 365/200, 201, 365/230.09, 230.04, 230.06, 230.03

(56) References Cited

U.S. PATENT DOCUMENTS

| | | | | |
|---|---|---|---|---|
| 5,355,339 A | * | 10/1994 | Oh et al. ..................... 365/200 |
| 5,383,156 A | * | 1/1995 | Komatsu ..................... 365/200 |
| 5,633,826 A | * | 5/1997 | Tsukada ..................... 365/200 |
| 5,699,307 A | * | 12/1997 | Greason et al. ............. 365/200 |
| 6,188,618 B1 | | 2/2001 | Takase ........................ 365/200 |
| 6,301,163 B1 | * | 10/2001 | Hidaka et al. ............... 365/200 |

* cited by examiner

*Primary Examiner*—David Nelms
*Assistant Examiner*—Thong Le
(74) *Attorney, Agent, or Firm*—Banner & Witcoff, Ltd.

(57) ABSTRACT

A semiconductor memory integrated circuit is provided, which is capable of simultaneously applying voltage stress to normal signal lines and spare signal lines, thereby reducing the time required for performing a test. The semiconductor memory integrated circuit includes a memory cell array having a plurality of normal signal lines for selecting a memory cell, a redundant cell array including three or more of odd number of spare signal lines for compensating for defectiveness in the memory cell array, a decoder for decoding an address signal to select a normal signal line, a spare decoder, which is activated when a defective address signal is inputted, for decoding the defective address signal to select a spare signal line, and a test control circuit for controlling the decoder and the spare decoder to perform a test of applying voltage between adjacent signal lines in the normal signal lines and the spare signal lines. The test control circuit sets electric potential levels in a signal line group including the normal signal lines and the spare signal lines so that at the time of a test, electric potential levels of adjacent signal lines are opposite to each other.

24 Claims, 7 Drawing Sheets

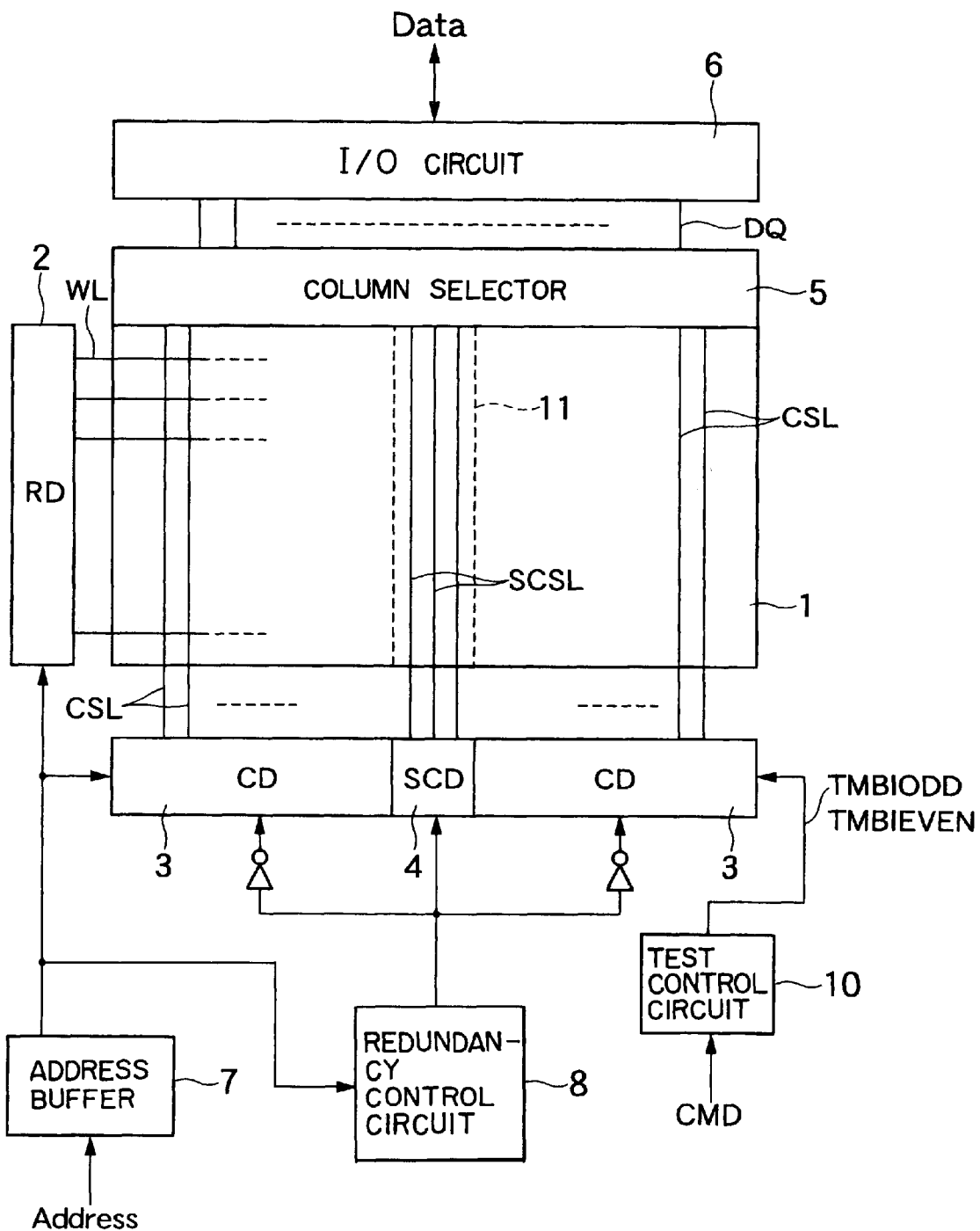
F I G. 1

SEMICONDUCTOR MEMORY INTEGRATED CIRCUIT EMPLOYING A REDUNDANT CIRCUIT SYSTEM FOR COMPENSATING FOR DEFECTIVENESS

CROSS REFERENCE TO RELATED APPLICATION

This application claims benefit of priority under 35USC §119 to Japanese Patent Applications No. 2000-170613, filed on Jun. 7, 2000, and No. 2001-116661, filed on Apr. 16, 2001, the contents of which are incorporated by reference herein.

BACKGROUND OF THE INVENTION

1. Field of the Invention

The present invention relates to semiconductor memory integrated circuit, such as DRAMs and, more particularly, to facilitating a burn-in test for a semiconductor memory integrated circuit employing a redundant circuit system for compensating for defectiveness.

2. Description of Related Art

In a large-scale semiconductor memory circuit, a number of signal lines are provided to a memory cell array. For example, a 256 Mbit DRAM includes 128K word lines, 512K pairs of bit lines, and 2K column selecting lines. Among these signal lines, those used for the same purpose are arranged adjacent to each other by using the same wiring layer.

Addresses are assigned to these signal lines in the memory cell array. Generally, a signal line having an odd-numbered address is arranged adjacent to a signal line having an even-numbered address. In a semiconductor memory circuit employing a redundant circuit system, besides a normal memory cell array, a redundant cell array is provided. Addresses are assigned to a plurality of spare signal lines in such a redundant cell array so that an odd-numbered address is adjacent to an even-numbered address, separate from the normal signal lines in the memory cell array.

A redundant cell array is provided so as to be adjacent to a memory cell array, or sandwiched between sub-blocks of a memory cell array. In both the cases, normal signal lines of the memory cell array and spare signal lines of the redundant cell array are not distinguished from each other in the physical layout, but are successively arranged.

Before shipment of a semiconductor memory circuit, a burn-in test is carried out so as to screen out initial failures. A burn-in test often includes applying a voltage between adjacent signal lines so as to carry out an accelerated test of potential short circuits. In this voltage-applying accelerated test, the amount of time required for applying voltage stress between adjacent lines in a number of signal lines, possibly numbering as many as several hundred thousand, is of vital importance. Whether this time can be reduced is a factor in cost-reduction.

If even-numbered addresses and odd-numbered addresses are alternately assigned to signal lines of a DRAM or the like, as mentioned previously, it is possible to simultaneously apply voltage stress between a number of pairs of signal lines adjacent to each other by activating, e.g., the signal lines having the even-numbered addresses. If normal signal lines and spare signal lines are successively arranged, and if the numbers of both the signal lines and the spare lines are even numbers, it is possible to simultaneously apply voltage stress between adjacent lines in the normal signal lines and the spare signal lines by assigning an even-numbered address and an odd-numbered address to each pair of adjacent signal lines.

However, there are cases where there are an odd number of spare signal lines in a redundant cell array. The reason for this is that since the number of spare signal lines is determined by a trade-off between chip size and defect density, sometimes an odd number of lines is selected as the optimum number. In this case, even if it is intended to simultaneously apply voltage stress between adjacent lines of all the normal signal lines and the spare signal lines by selecting all the odd-numbered addresses or all the even-numbered addresses, it is not possible to do it since there may be a portion at a boundary between the normal signal lines and the spare signal lines where both adjacent two signal lines have odd-numbered addresses or even-numbered addresses. In such a case, it is not possible to prevent increases in test time and test costs.

SUMMARY OF THE INVENTION

Given the above-described circumstances, it is an object of the present invention to provide a semiconductor memory integrated circuit which can simultaneously apply voltage stress to all the normal signal lines and spare signal lines to achieve the shortening of test time.

According to a first aspect of the present invention, a semiconductor memory integrated circuit is provided which comprises: a memory cell array in which a plurality of normal signal lines for selecting a memory cell are arranged; a redundant cell array in which three or more odd number spare signal lines for compensating for defectiveness in said memory cell array are arranged; a decoder for decoding an address signal to select a normal signal line; a spare decoder, which is activated when a defective address signal is inputted, for decoding the defective address signal to select a spare signal line; and a test control circuit for controlling the decoder and the spare decoder to carry out a test of applying a voltage between adjacent lines in the normal signal lines and the spare signal lines, at the time of performing a test, said test control circuit setting potential levels in a signal line group including the normal signal lines and the spare signal lines so that potential levels of two adjacent signal lines are opposite to each other.

In the semiconductor memory integrated circuit of the first aspect according to the present invention, potential levels of two adjacent signal lines in a signal line group including normal signal lines and spare signal lines are set to be opposite to each other. In this way, it is possible to simultaneously apply voltage stress to the normal signal lines and the spare signal lines, thereby reducing the time required for testing a semiconductor memory circuit, and/or the cost involved in carrying out such a test.

According to a second aspect of the present invention, a semiconductor memory integrated circuit is provided which comprises: a memory cell array in which a plurality of normal signal lines for selecting a memory cell are arranged; a redundant cell array in which three or more odd number spare signal lines for compensating for defectiveness in said memory cell array are arranged; a decoder for decoding an address signal to select a normal signal line; a spare decoder, which is activated when a defective address signal is inputted, for decoding the defective address signal to select a spare signal line; and a test control circuit for controlling the decoder and the spare decoder to carry out a test of applying a voltage between adjacent lines in the normal signal lines and the spare signal lines, at the time of performing a test, said test control circuit assigning addresses to successively arranged signal lines included in a signal line group so that even-numbered addresses and odd-numbered addresses are alternately assigned.

In the semiconductor memory integrated circuit of the second aspect according to the present invention, even-numbered addresses and odd-numbered addresses are alternately assigned to a group of successively arranged signal lines including normal signal lines in a memory cell array and spare signal lines in a redundant cell array. In this way, it is possible to simultaneously apply voltage stress to the normal signal lines and the spare signal lines, thereby reducing the time required for testing a semiconductor memory circuit, and/or the cost involved in carrying out such a test.

BRIEF DESCRIPTION OF THE DRAWINGS

The present invention will be understood more fully from the detailed description given here in below and from the accompanying drawings of the preferred embodiments of the invention. However, the drawings are not intended to imply limitation of the invention to a specific embodiment, but are for explanation and understanding only.

In the drawings:

FIG. 1 shows an arrangement of a DRAM according to a first embodiment of the present invention;

DESCRIPTION OF THE PREFERRED EMBODIMENTS

Hereinafter, preferred embodiments of the present invention will be described with reference to the accompanying drawings.

Figure 2:
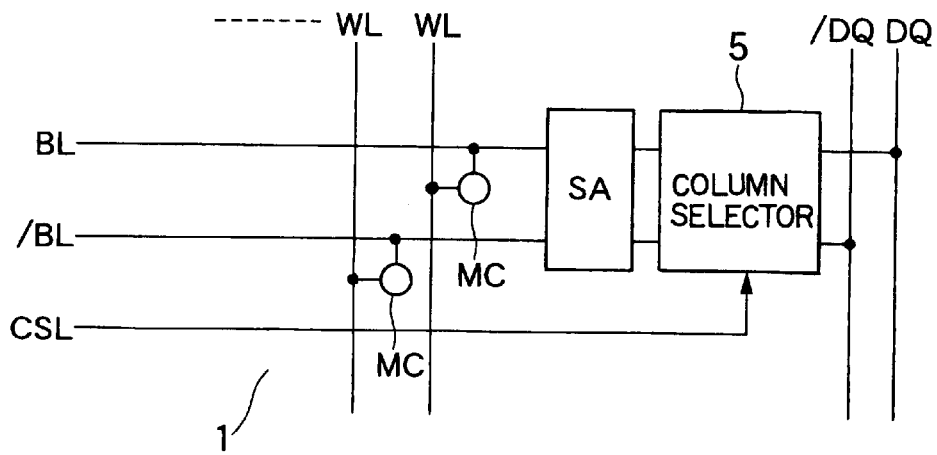
FIG. 2 shows an arrangement of a memory cell array of the DRAM according to the first embodiment.

FIG. 1 shows a DRAM arrangement according to a first embodiment of the present invention. A memory cell array 1 is formed of a plurality of bit lines BL, /BL, a plurality of word lines WL, and dynamic memory cells MC provided at the intersections of the bit lines and word lines, as shown in FIG. 2. The bit lines BL and /BL are connected to data lines DQ, /DQ via a sense amplifier SA and a column selector 5. The data lines DQ, /DQ send data to and receive data from I/O terminals via an I/O circuit 6.

In FIG. 1, the memory cell array 1 is divided into two sub cell arrays by a redundant column cell array 11. If column selecting lines (normal column selecting lines) CSL in the memory cell array 1 include a defective line, one of spare column selecting lines SCSL in the redundant column cell array 11 is selected to replace it. The number of the spare column selecting lines SCSL of the redundant column cell array 11 is an odd number in this embodiment, and is three in FIG. 1.

A column decoder 3 and a spare column decoder 4 select a normal column selecting line CSL and a spare column selecting line SCSL, respectively. A row decoder 2 selects a word line WL. Column addresses and row addresses are supplied to the column decoder 3 and the row decoder 2 via an address buffer 7.

A redundancy control circuit 8 is provided for replacing a defective normal column selecting line CSL with a spare column selecting line SCSL. As is well known, the redundancy control circuit 8 includes a defective address storing circuit using a fuse etc., and a coincidence detection circuit for performing coincidence detection between an externally provided address signal and an address stored in the defective address storing circuit, and for outputting a replacement signal. Thus, when a defective address is inputted, the column decoder 3 is controlled to be deactivated, and the spare column decoder 4 is controlled to be activated.

In this embodiment, odd-numbered addresses and even-numbered addresses are alternately assigned to the normal column selecting lines CSL in the memory cell array 1 and the spare column selecting lines SCSL in the redundant cell array 11. When a burn-in test is carried out, all the normal column selecting lines CSL of the memory cell array 1 and the spare column selecting lines SCSL of the redundant column cell array 11 having odd-numbered addresses or alternatively all the normal column selecting lines CSL and the spare column selecting lines SCSL having even-numbered addresses are selected so as to simultaneously apply voltage stress between adjacent lines in all of these lines.

A test control circuit 10 is provided in order to enable such voltage stress application. Receiving a command CMD, the test control circuit 10 sets the column decoder 3 and the spare column decoder 4 to a test state for carrying out all odd-numbered address selections or all even-numbered address selections. As mentioned previously, when the number of the spare column selecting lines SCSL is an even number, it is possible to alternately give "H" and "L" potential levels to the normal column selecting lines and the spare column selecting lines by performing all odd-numbered address selections or alternatively all even-numbered address selections. However, in this embodiment, since the number of the spare column lines SCSL is an odd number, specifically three, a simple operation for carrying out all odd-numbered address selections or all even-numbered address selections may result in that two adjacent lines at the boundary between the normal column selecting lines CSL and the spare column selecting lines SCSL are at the "H" level or the "L" level.

Figure 3:
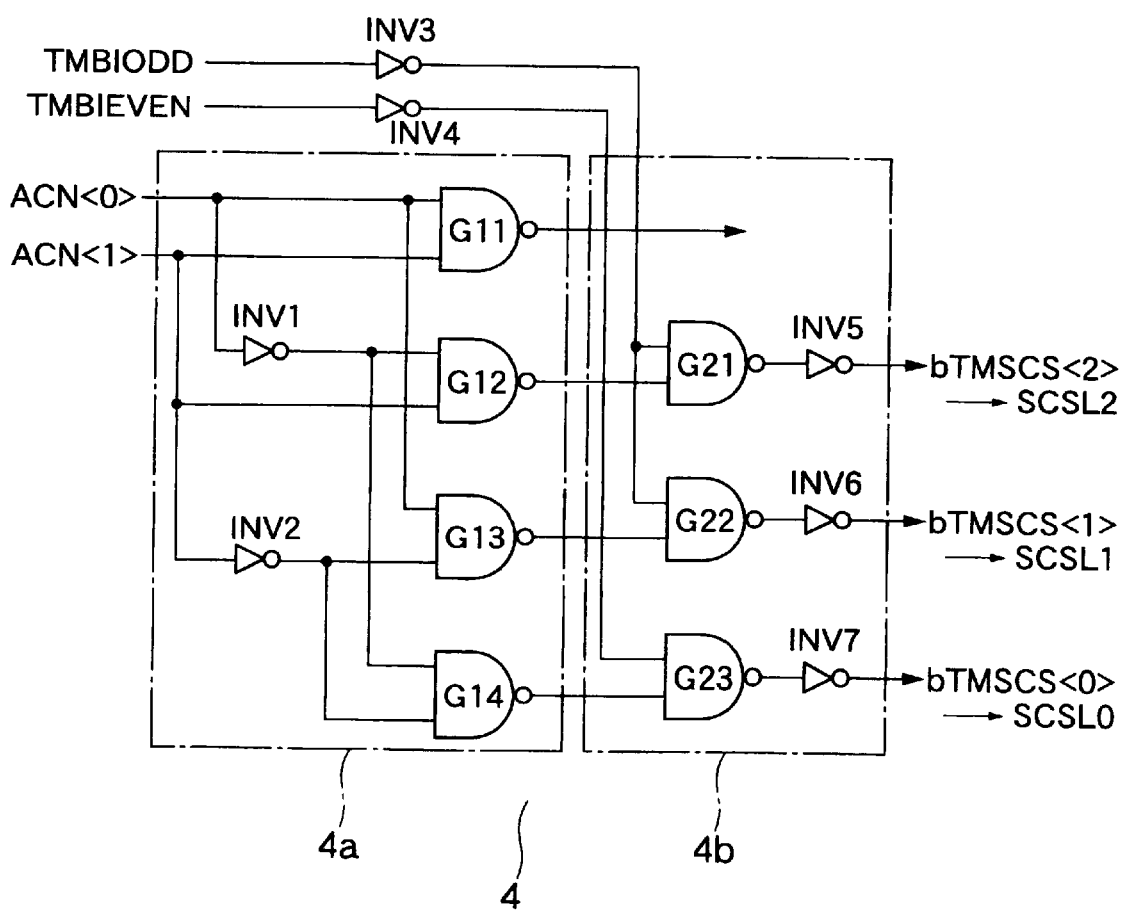
FIG. 3 shows an arrangement of a spare column decoder of the DRAM according to the first embodiment.
Figure 4:
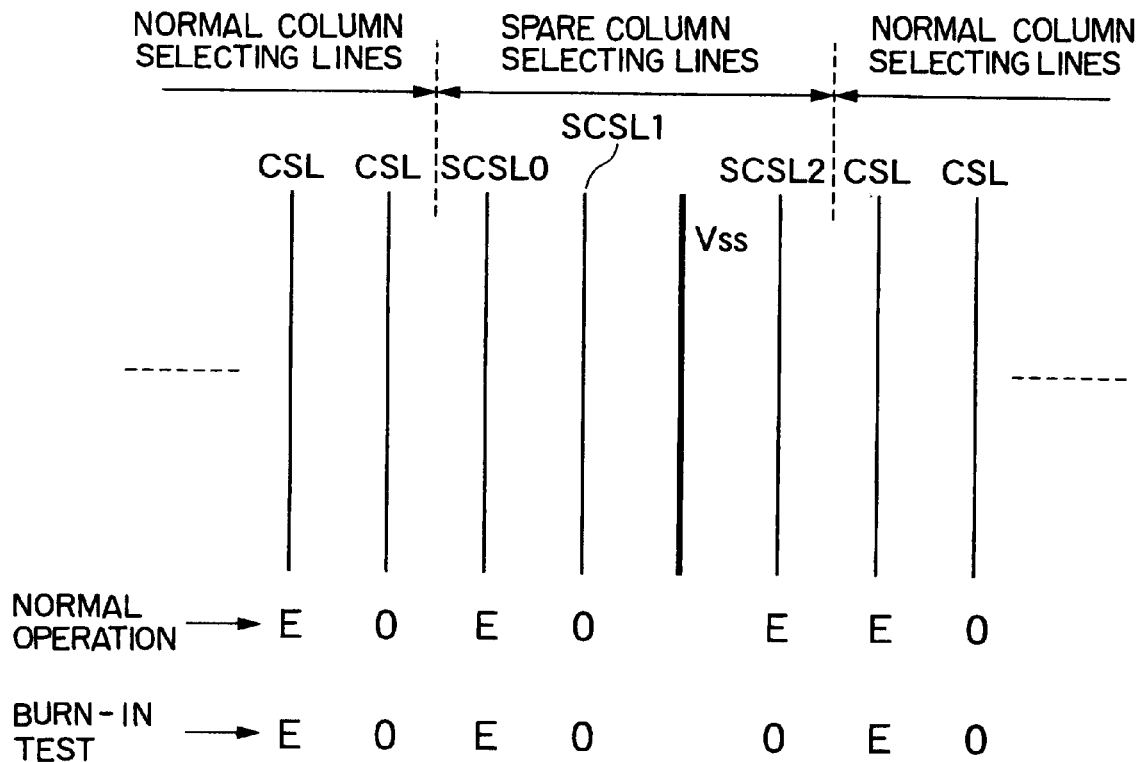
FIG. 4 shows assignments of addresses to normal column selecting lines and spare column selecting lines in a normal operation and in a test of the DRAM according to the first embodiment.

In this embodiment, such a problem is avoided, and it is possible to perform a simultaneous voltage stress application test for the normal column selecting lines and the spare column selecting lines by carrying out all odd-numbered address selections or all even-numbered address selections. Specifically, an example will be described in which the number of the spare column lines is three, and a simultaneous voltage stress application is carried out for the normal column selecting lines CSL and the spare column selecting lines SCSL. FIG. 3 shows a specific arrangement of a part of a spare column decoder 4 for enabling such simultaneous voltage stress application. FIG. 4 shows an example of the arrangement of the spare column selecting lines SCSL with the normal column selecting lines CSL provided on both sides of the spare column selecting lines SCSL.

As shown in FIG. 4, the three spare column selecting lines SCSL0, SCSL1, and SCSL2 with a number of normal column lines provided on both sides of the spare column selecting lines are successively arranged at regular intervals. A power supply line VSS always at an "L" level is arranged between the adjacent spare column selecting lines SCSL1 and SCSL2 provided near one boundary with the normal column selecting lines CSL.

FIG. 4 shows how addresses are assigned to the normal column selecting lines CSL and the spare column selecting lines SCSL during a normal operation. Specifically, even-numbered addresses (E) and odd-numbered addresses (O) are alternately assigned to the normal column selecting lines CSL, skipping the spare column selecting lines SCSL. If the number of the spare column selecting lines SCSL is three, the lines placed on both sides have even-numbered addresses, and the central line has an odd-numbered address. At this time, both the spare column selecting line SCSL2 and the normal column selecting line adjacent thereto have even-numbered addresses.

Therefore, at the time of a burn-in test, even if the potential levels of all the normal column selecting lines CSL and spare column selecting lines SCSL having even-numbered addresses, or alternatively odd-numbered addresses, are set to be at the "H" level, no voltage stress is applied between the spare column selecting line SCSL2 and the normal column selecting line CSL adjacent thereto. In order to deal with this, in this embodiment, at the time of a burn-in test, the two spare column selecting lines SCSL1 and SCSL2 placed on both sides of the power supply line VSS are assigned odd-numbered addresses to have the "H" potential level, and then all odd-numbered address selections are performed. In this way, on both sides of the power supply line VSS (which is always at the "L" level), the normal column selecting lines CSL and the spare column selecting lines SCSL are alternately set to the "H" potential level and the "L" potential level. As a result, it is possible to apply voltage stress between all the adjacent lines.

In order to switch the arrangement of odd-numbered addresses and even-numbered addresses of the spare column selecting lines between a normal operation and a burn-in test, the spare column decoder 4 includes a decoder body 4a, and a gate circuit 4b for performing all odd-numbered address selections and all even-numbered address selections. The decoder body 4a consists of NAND gates G11–G14 for producing a logical output of a 2-bit address signal ACN<0, 1> and an inverted signal thereof. In this embodiment, however, since the number of the spare column selecting lines SCSL is three, the output of the NAND gate G11 is not used.

The gate circuit 4b consists of two-input NAND gates G21, G22, and G23 for receiving outputs of the NAND gates G12, G13, and G14 of the spare column decoder 4. A test control signal TMBIODD is inputted to the other input terminals of the NAND gates G21 and G22 via an inverter INV3. Another test control signal TMBIEVEN is inputted to the other input terminal of the NAND gate G23 via an inverter INV4. The outputs of the NAND gates G21, G22, and G23 are supplied to the spare column selecting lines SCSL2, SCSL1, and SCSL0 as outputs bTMSCS<2>, bTMSCS<1>, and bTMSCS<3> via inverters INV5, INV6, and INV7, respectively.

In order to perform all odd-numbered address selections or alternatively all even-numbered address selections, the column decoder 3 also includes a gate circuit similar to the gate circuit 4b for receiving the test control signals TMBIODD and TMBIEVEN shown in FIG. 3. In the gate circuit 4b of the spare column decoder 4 of FIG. 3, the test control signal TMBIEVEN for carrying out all even-numbered address selections is inputted to only the NAND gate G23 having an even-number address (0), and the test control signal TMBIEVEN for carrying out all odd-numbered address selections is simultaneously inputted to the NAND gate G22 having an odd-numbered address (1) and the NAND gate G23 having an even-numbered address (2) subsequent thereto.

In a normal operation, both the test control signals TMBIODD and TMBIEVEN are at the "L" level. At this time, all of the NAND gates G21, G22, and G23 of the gate circuit 4b are held in an activated state, and outputs from the decoder body 4a are received as they are, i.e., as bTMSCS<2>, bTMSCS<1>, and bTMSCS<0>. Therefore, if the address signal ACN<0, 1> indicates an even-numbered address, the spare column selecting lines SCSL0 and SCSL2 are selected, and if the address signal ACN<0, 1> indicates an odd-numbered address, the spare selecting line SCSL1 is selected, resulting in the address assignment to the spare column selecting lines in a normal operation, as shown in FIG. 4.

At the time of a burn-in test, the potential level of one of the test control signals TMBIODD and TMBIEVEN is set to be at the "H" level. Specifically, in this embodiment, the test control signal TMBIEVEN is set to be at the "H" level in order to set the signal lines to an all odd-numbered address selection state. At this time, in the gate circuit 4b, the NAND gates G21 and G22 are activated. If all of the outputs of the decoder body 4a are at the "H" level, bTMSCS<1> and bTMSCS<2> are at the "H" level, and bTMSCS<0> is at the "L" level. Accordingly, the state shown in FIG. 4 is established, i.e., the two spare column selecting lines SCSL1 and SCSL2, which are adjacent to each other with the power supply line VSS placed therebetween, are selected as having the odd-numbered addresses (O), and thus set to be at the "H" level. In this way, the power supply line VSS is held as a pseudo signal line, and voltage stress is applied between all the adjacent signal lines among the column selecting lines CSL and the spare column selecting lines SCSL.

As mentioned above, according to this embodiment, a power supply line is provided between two adjacent spare column selecting lines SCSL at the boundary with the column selecting lines CSL, and at the time of carrying out a burn-in test by selecting all the odd-numbered addresses, these two spare column selecting lines are simultaneously set to be at the "H" level. As a result, with the power supply line held as a pseudo spare column selecting line, all the column selecting lines and spare column selecting lines are alternately set to be at the "H" level and "L" level. Thus, it is possible to simultaneously apply voltage stress to all the signal lines.

Although the power supply line VSS which is always at the "L" level is used in this embodiment, another power supply line VDD which is always at the "H" level can be used in its place. In this case, the test control signal line TMBIODD may be set to be at the "H" level to hold the column decoder 3 and the spare column decoder 4 in the state of all even-numbered address selections. At this time, the two spare column lines SCSL1 and SCSL2, which are adjacent to each other with the power supply line VDD placed therebetween, are simultaneously set to be at the "L" level. Thus, it is possible to apply voltage stress between adjacent lines in all the column selecting lines and spare column selecting lines placed on both sides of the power supply line VDD.

Figure 5:
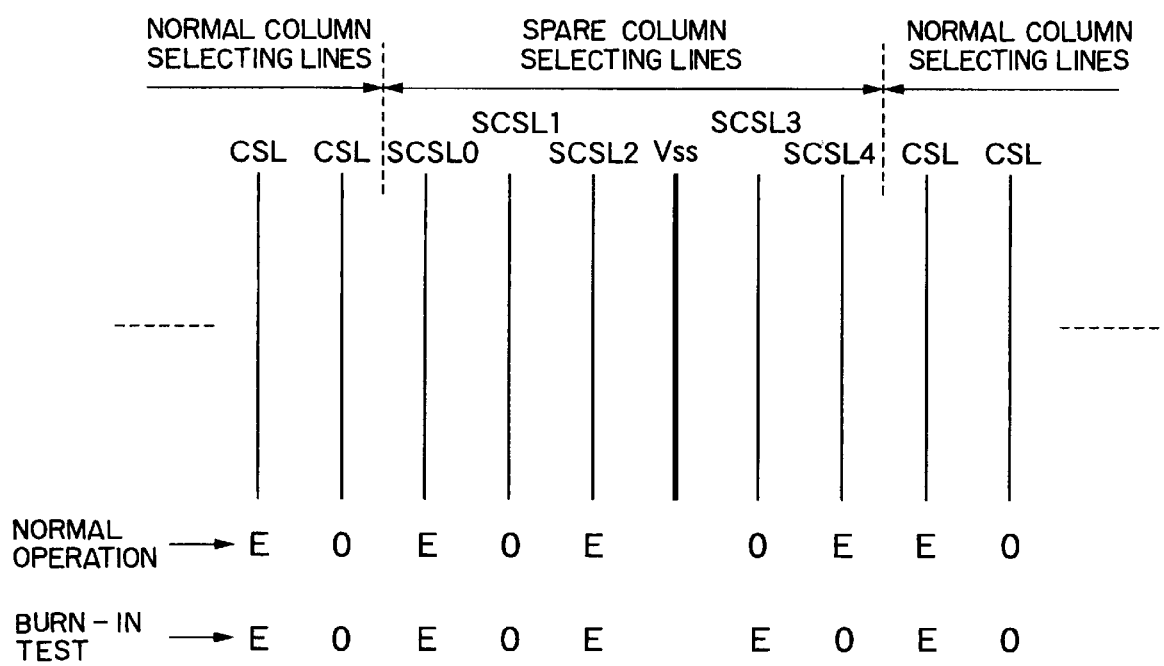
FIG. 5 shows assignments of addresses to normal column selecting lines and spare column selecting lines in a normal operation and in a test of a DRAM modified from the DRAM of the first embodiment.

In this embodiment, an example of the case where three spare column lines are provided is described. However, the present invention is not limited to this, but can generally be applied to cases where the number of the spare column lines is an odd number, and normal column selecting lines are provided on both sides of the spare column lines. For example, FIG. 5 shows the number of the spare column selecting lines being five. In this case, a simultaneous voltage stress test can be performed by providing a power supply line VSS between the two spare column selecting lines SCSL2 and SCSL3, which are near the boundary with the normal column selecting lines CSL, and by setting these two spare column selecting lines to be simultaneously at the "H" level or the "L" level at the time of a burn-in test.

The first embodiment is described under an assumption that addresses are assigned to the normal column signal lines CSL in two sub cell arrays provided on both sides of the redundant cell array so that even-numbered addresses (E) and odd-numbered addresses (O) are alternately and successively assigned to the normal column signal lines CSL, skipping the redundant cell array, and the above assignment is not changed at the time of a burn-in test. Under this assumption, at either boundary between the three spare column selecting lines SCSL and the normal column selecting lines CSL, two adjacent lines are successively assigned even-numbered addresses or odd-numbered addresses regardless of whether the address assignment to the three spare column selecting lines CSL is E, O, E, or O, E, O. Accordingly, it is necessary to provide a power supply line to be used as a pseudo signal line.

However, if the arrangement order of odd-numbered addresses and even-numbered addresses in the memory cell array can be changed at the time of a burn-in test, it is not necessary to provide a power line as a pseudo signal line to the redundant cell array. Such a case will be described as a second embodiment of a semiconductor memory integrated circuit according to the present invention, with reference to FIG. 6. In the second embodiment shown in FIG. 6, a memory cell array is divided into a plurality of sub cell arrays A1, A2, . . . Redundant cell arrays B1, B2, . . . , each corresponding to one of the sub cell arrays are also provided so that the sub cell arrays and the redundant cell arrays are alternately arranged. Each redundant cell array includes an odd number (in the drawing, three) of spare signal lines.

Figure 6:
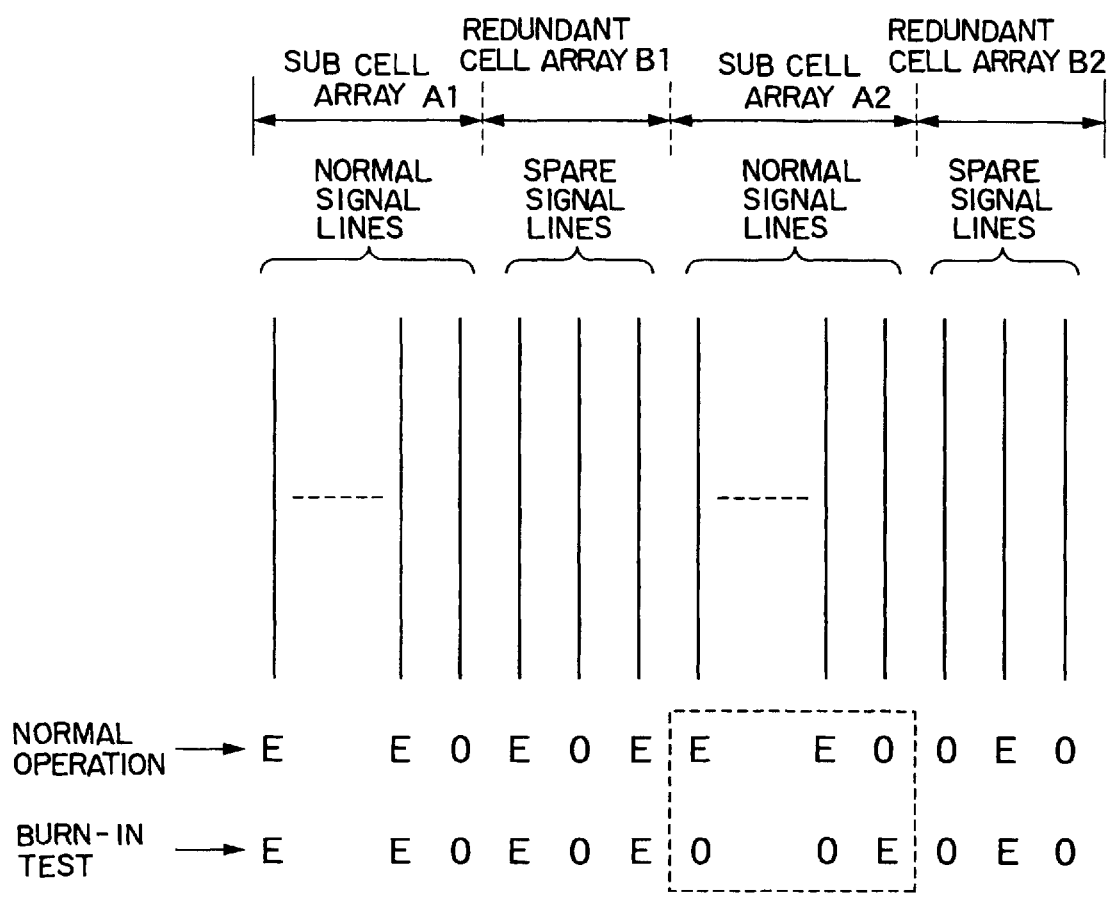
FIG. 6 shows assignments of addresses to normal column selecting lines and spare column selecting lines in a normal operation and in a test of a DRAM according to a second embodiment according to the present invention.

It is assumed that in a normal operation, addresses are assigned to the sub cell arrays A1, A2, . . . , so that even-numbered addresses (E) and odd-numbered addresses (O) are alternately and successively assigned, skipping the redundant cell arrays, as shown in FIG. 6. The same applies to the redundant cell arrays B1, B2, . . . Under such an assumption, both a spare signal line of the redundant cell array B1 and a normal signal line of the sub cell array A2 adjacent to each other have even-numbered addresses, and both a normal signal line of the sub cell array A2 and a spare signal line of the redundant cell array B2 adjacent to each other have odd-numbered addresses.

In order to deal with this, at the time of a burn-in test, the arrangement order of odd-numbered addresses and even-numbered addresses of the normal signal lines in the sub cell array A2 is reversed from that of a normal operation, as shown in the portion surrounded by a broken line in FIG. 6. In this way, the successiveness of the arrangement order of odd-numbered addresses and even-numbered addresses can be maintained to cover all the signal lines and spare signal lines in the entire memory cell array including the redundant cell arrays. Thus, it is possible to carry out a simultaneous voltage stress application. The switching of address assignment between a normal operation and a burn-in test can be made for the column decoder in a manner similar to that made for the spare column decoder shown in FIG. 3.

Figure 7:
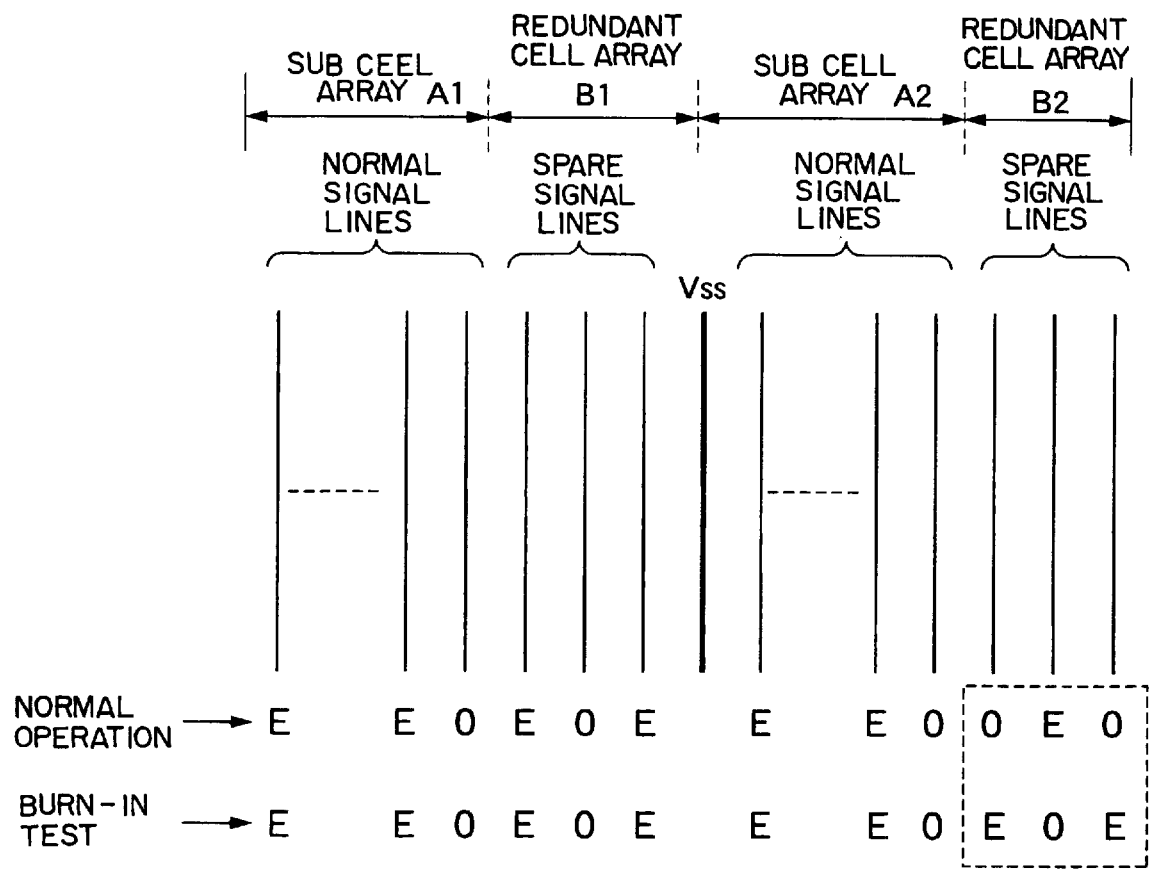
FIG. 7 shows assignments of addresses to normal column selecting lines and spare column selecting lines in a normal operation and in a test of a DRAM according to a third embodiment of the present invention.
Figure 8:
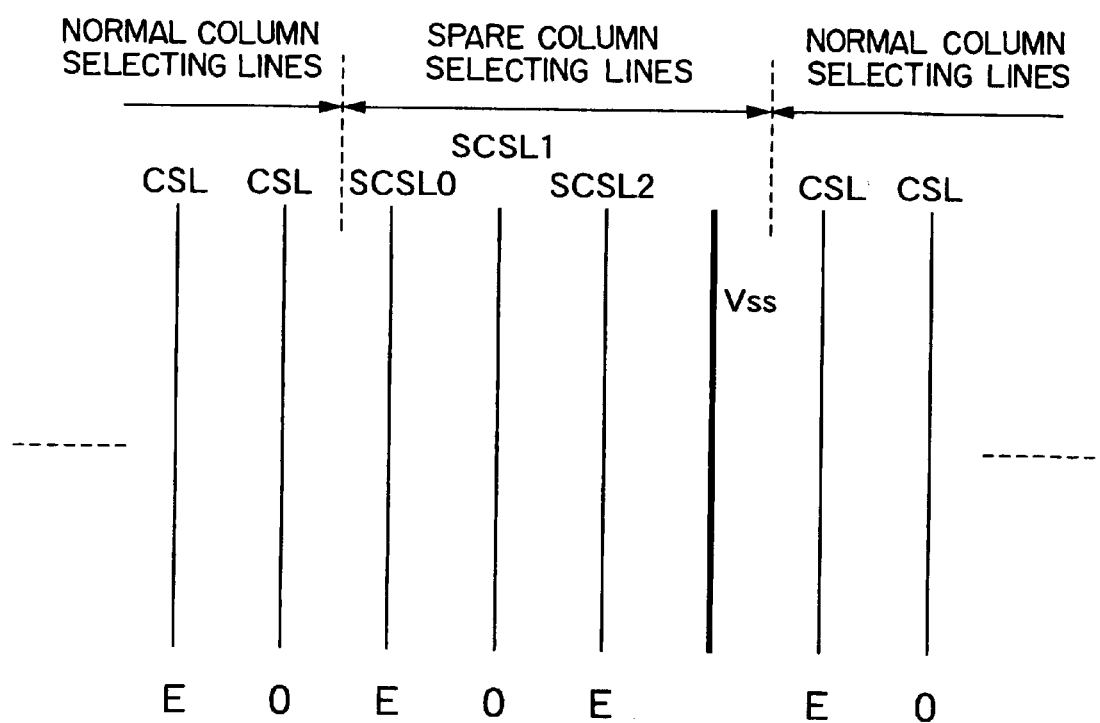
FIG. 8 shows assignments of addresses to normal column selecting lines and spare column selecting lines in a normal operation and in a test of a DRAM modified from the DRAM of the third embodiment.

Generally, a power supply line is provided for every predetermined number of signal lines in a memory cell array. For example, if, in the second embodiment shown in FIG. 6, a power supply line VSS is provided between the sub cell array A2 and the redundant cell array B1 a third embodiment of the present invention shown in FIG. 7 is obtained. In this case, at the boundary between the sub cell array A2 and the redundant cell array B1, both of the adjacent two lines are assigned even-numbered addresses with the power line VSS placed therebetween. Therefore, it is not necessary to reverse the arrangement order of odd-numbered addresses and even-numbered addresses at the time of a burn-in test at this portion. In this case, it is necessary to reverse the arrangement order of odd-numbered addresses and even-numbered addresses of the spare signal lines in the redundant cell array B2, as shown in the portion surrounded by a broken line in FIG. 7. In this way, the "H" and "L" arrangement of all the signal lines and the spare signal lines in the memory cell array is successively accomplished, and at the time of a burn-in test, it is possible to simultaneously apply voltage stress between adjacent lines in these lines by all even-numbered address selections or all odd-numbered address selections. FIG. 8 shows a modification of the third embodiment, in which a memory cell array is divided into two sections, which are provided on both sides of a redundant cell array. In this modified embodiment, a burn-in test can be carried out without changing addresses by providing a power supply line VSS at a boundary between spare column selecting lines and normal column selecting lines.

In the above-described embodiments, a voltage application test is performed simultaneously on the spare column selecting lines of the redundant column cell array and the normal column selecting lines. However, the present invention is not limited to such cases, but is also effective when a similar test is carried out on signal lines and spare signal lines having a relationship similar to that between the column selecting lines and the spare column selecting lines. For example, the present invention can be applied to the case where a memory cell includes a redundant row cell array having spare word lines, and a simultaneous voltage application test is carried out for normal word lines and spare word lines.

FIG. 5 shows a modification of the first embodiment shown in FIG. 4. In both the first embodiment and its modification, a power supply line such as the power supply line VSS is provided at about the midpoint of the spare column selecting lines. The reason for this is to strengthen the pattern continuity to improve yields, thereby reducing the cost of manufacturing, as well as to eliminate partially weakened portions, thereby achieving more stable operations. The above will be explained hereinafter. For example, in the first embodiment shown in FIG. 4, a single spare column selecting line corresponds to a plurality (e.g., eight) of spare bit lines. Because of this, since the three spare column selecting lines are separated by the power supply line VSS by a ratio of two to one, the bit lines are separated by 16 to 8, i.e., the difference in number of bit lines is eight. If the three spare column selecting lines are separated by the power supply line VSS by a ratio of three to zero, the difference in number of bit lines is 24. For this reason, it is possible to strengthen the pattern continuity to improve yields by providing a power supply line at about the midpoint of spare column selecting lines, as in the cases of the first embodiment and its modification. Further, by providing power supply lines at regular intervals as much as possible, it is possible to eliminate partially weakened portions, thereby improving the stability of operations of a sense amplifier or the like.

Providing a circuit for changing addresses of spare column selecting lines at the time of a test, as in the above-described embodiments, requires an additional circuit area. However, since such a circuit can typically be formed in a memory section, which has a relatively broad area, it is possible to obtain a memory circuit, which is relatively symmetrical in terms of the positions of cell arrays, manufactured at low cost, and operates in a stable fashion.

As mentioned above, according to the present invention, it is possible to obtain a semiconductor memory integrated circuit capable of simultaneously applying voltage stress to normal signal lines and spare signal lines by all even-numbered address selections or all odd-numbered address selections in order to reduce the time needed for a test.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory integrated circuit comprising:
   a memory cell array in which a plurality of normal signal lines for selecting a memory cell are arranged;
   a redundant cell array in which three or more of odd number of spare signal lines for compensating for defectiveness in said memory cell array are arranged;
   a decoder for decoding an address signal to select a normal signal line;
   a spare decoder, which is activated when a defective address signal is inputted, for decoding the defective address signal to select a spare signal line; and
   a test control circuit for controlling said decoder and said spare decoder to carry out a test of applying a voltage between adjacent lines in said normal signal lines and said spare signal lines,
   at the time of performing the test, said test control circuit setting potential levels in a signal line group including said normal signal lines and said spare signal lines so that a plurality of signal lines included in said signal line group are turned active simultaneously and potential levels of two adjacent signal lines are opposite to each other.

2. The semiconductor memory integrated circuit according to claim 1, wherein a wiring line having a fixed electric potential is provided in said odd number of spare signal lines, and at the time of performing the test, said wiring line is used as a pseudo signal line included in said signal line group.

3. The semiconductor memory integrated circuit according to claim 1, wherein said memory cell array is divided into sections which are provided on both sides of said redundant cell array, and said normal signal lines, which are provided on both sides of said spare signal lines in said redundant cell array, are assigned sequential addresses.

4. The semiconductor memory integrated circuit according to claim 1, wherein said redundant cell array is a redundant column cell array, and said normal signal lines and said spare signal lines are column selecting lines and spare column selecting lines, respectively, for performing a bit line selection in said memory cell array and said redundant column cell array.

5. The semiconductor memory integrated circuit according to claim 1, wherein:
   said memory cell array is divided into sub cell arrays, which are provided on both sides of said redundant cell array;
   at the time of a normal operation, said normal signal lines, which are provided on both sides of said spare signal lines in said redundant cell array, are assigned addresses so that even-numbered addresses and odd-numbered addresses are alternately and successively assigned; and
   at the time of the test, the arrangement order of even-numbered addresses and odd-numbered addresses is reversed for said normal signal lines provided on both sides of said spare signal lines of said redundant cell array.

6. The semiconductor memory integrated circuit according to claim 5, wherein:
   said redundant cell array is divided into sections each including an odd number of spare lines, which are provided on both sides of said sub cell arrays; and
   said spare signal lines, which are provided on both sides of said sub cell arrays, are assigned sequential addresses.

7. The semiconductor memory integrated circuit according to claim 1, wherein at the time of performing a test, said test control circuit sets potential levels of said normal signal lines and said spare signal lines in said signal group so that potential levels of two adjacent signal lines are opposite to each other, by alternately assigning even-numbered addresses and odd-numbered addresses.

8. The semiconductor memory integrated circuit according to claim 7, wherein:
   said memory cell array is divided into a plurality of sub cell arrays;
   a plurality of said redundant cell arrays each having an odd number of spare signal lines are provided so that a sub cell array is adjacent to a redundant cell array;
   at the time of a normal operation, said normal signal lines in said memory cell array and said spare signal lines in said redundant cell arrays are assigned addresses so that even-numbered addresses and odd-numbered addresses are alternately and successively assigned; and
   at the time of the test, the arrangement order of even-numbered addresses and odd-numbered addresses in at least one of said redundant cell arrays is reversed so that potential levels of two adjacent signal lines in said signal group are opposite to each other.

9. A semiconductor memory integrated circuit comprising:
   a memory cell array in which a plurality of normal signal lines for selecting a memory cell are arranged;
   a redundant cell array in which three or more of odd number of spare signal lines for compensating for defectiveness in said memory cell array are arranged;

a decoder for decoding an address signal to select a normal signal line;

a spare decoder, which is activated when a defective address signal is inputted, for decoding the defective address signal to select a spare signal line; and a test control circuit for controlling said decoder and said spare decoder to carry out a test of applying a voltage between adjacent lines in said normal signal lines and said spare signal lines, at the time of performing the test, said test control circuit assigning addresses to said signal lines included in a signal line group having said normal signal lines and said spare signal lines so that even-numbered addresses and odd-numbered addresses are alternately assigned.

10. The semiconductor memory integrated circuit according to claim 9, wherein a wiring line having a fixed electric potential is provided in said odd number of spare signal lines, and at the time of performing the test, said wiring line is used as a pseudo signal line included in said signal line group.

11. The semiconductor memory integrated circuit according to claim 9, wherein said memory cell array is divided into sections which are provided on both sides of said redundant cell array, and said normal signal lines, which are provided on both sides of said spare signal lines in said redundant cell array, are assigned sequential addresses.

12. The semiconductor memory integrated circuit according to claim 9, wherein said redundant cell array is a redundant column cell array, and said normal signal lines and said spare signal lines are column selecting lines and spare column selecting lines, respectively, for performing a bit line selection in said memory cell array and said redundant column cell array.

13. The semiconductor memory integrated circuit according to claim 9, wherein:

said memory cell array is divided into sub cell arrays, which are provided on both sides of said redundant cell array;

at the time of a normal operation, said normal signal lines, which are provided on both sides of said spare signal lines in said redundant cell array, are assigned addresses so that even-numbered addresses and odd-numbered addresses are alternately and successively assigned; and at the time of the test, the arrangement order of even-numbered addresses and odd-numbered addresses is reversed for said normal signal lines provided on both sides of said spare signal lines of said redundant cell array.

14. The semiconductor memory integrated circuit according to claim 13, wherein:

said redundant cell array is divided into sections each including an odd number of spare lines, which are provided on both sides of said sub cell arrays; and said spare signal lines, which are provided on both sides of said sub cell arrays, are assigned sequential addresses.

15. The semiconductor memory integrated circuit according to claim 9, wherein:

said memory cell array is divided into a plurality of sub cell arrays;

a plurality of said redundant cell arrays each having an odd number of spare signal lines are provided so that a sub cell array is adjacent to a redundant cell array;

at the time of a normal operation, said normal signal lines in said memory cell array and said spare signal lines in said redundant cell arrays are assigned addresses so that even-numbered addresses and odd-numbered addresses are alternately and successively assigned; and at the time of the test, the arrangement order of even-numbered addresses and odd-numbered addresses in at least one of said redundant cell arrays is reversed so that potential levels of two adjacent signal lines in said signal group are opposite to each other.

16. A method for testing a semiconductor memory device, the method comprising:

assigning a unique first address to at least some of each of a plurality of signal lines in a normal mode, the plurality of signal lines including normal signal lines and spare signal lines; and assigning, in test mode, a second address to at least one of the plurality of signal lines, the second address being either odd-numbered when the first address is even-numbered or even-numbered when the first address is odd-numbered.

17. The method of claim 16, further including simultaneously applying a voltage stress between each adjacent signal line in the plurality of signal lines.

18. The method of claim 16, wherein the plurality of signal lines alternate between even numbered and odd numbered addresses.

19. The method of claim 16, wherein the semiconductor memory device includes a fixed-potential line having a potential corresponding to a logic level disposed between two of the plurality of signal lines, the two of the plurality of signal lines each being assigned an even address in the test mode, the method further including the step of simultaneously applying a same logic level as the fixed-potential line to each of the plurality of signal lines that have an odd address in the test mode.

20. The method of claim 19, wherein the plurality of signal lines on a first side of the fixed-potential line have alternating even and odd addresses in the test mode, and the plurality of signal lines on an opposing side of the fixed-potential line have alternating even and odd addresses in the test mode.

21. The method of claim 16, wherein the semiconductor memory device includes a fixed-potential line having a potential corresponding to a logic level disposed between two of the plurality of signal lines, the two of the plurality of signal lines each being assigned an odd address in the test mode, the method further including the step of simultaneously applying a same logic level as the fixed-potential line to each of the plurality of signal lines that have an even address in the test mode.

22. The method of claim 21, wherein the plurality of signal lines on a first side of the fixed-potential line have alternating even and odd addresses in the test mode, and the plurality of signal lines on an opposing side of the fixed-potential line have alternating even and odd addresses in the test mode.

23. A semiconductor memory integrated circuit having a group of signal lines, comprising:

a memory cell array having a plurality of normal signal lines as part of the group of signal lines, each having a unique first address;

a redundant cell array having an odd plurality of spare signal lines as part of the group of signal lines; and a circuit configured to assign a second address to at least one of the signal lines of the group of signal lines, the second address being either odd-numbered when the first address is even-numbered or even-numbered when the first address is odd-numbered, and to apply a voltage stress between each adjacent signal line of the group of signal lines.

24. A decoder comprising:

a normal mode circuit for selecting a signal line during normal operation;

a test mode circuit coupled to said normal mode circuit and configured to simultaneously select every other one of a plurality of signal lines, the plurality of signal lines including a plurality of normal signal lines and an odd plurality of spare signal lines.

* * * * *